United States Patent
Taki et al.

(10) Patent No.: US 12,222,640 B2
(45) Date of Patent: *Feb. 11, 2025

(54) REFLECTIVE MASK BLANK, REFLECTIVE MASK, METHOD OF MANUFACTURING REFLECTIVE MASK BLANK, AND METHOD OF MANUFACTURING REFLECTIVE MASK

(71) Applicant: AGC Inc., Tokyo (JP)

(72) Inventors: Shunya Taki, Tokyo (JP); Hiroaki Iwaoka, Tokyo (JP); Daijiro Akagi, Tokyo (JP); Ichiro Ishikawa, Tokyo (JP)

(73) Assignee: AGC Inc., Tokyo (JP)

(*) Notice: Subject to any disclaimer, the term of this patent is extended or adjusted under 35 U.S.C. 154(b) by 0 days.

This patent is subject to a terminal disclaimer.

(21) Appl. No.: 18/382,269

(22) Filed: Oct. 20, 2023

(65) Prior Publication Data

US 2024/0168370 A1 May 23, 2024

Related U.S. Application Data

(63) Continuation of application No. 18/193,674, filed on Mar. 31, 2023, now Pat. No. 11,829,065, which is a continuation of application No. PCT/JP2022/030631, filed on Aug. 10, 2022.

(30) Foreign Application Priority Data

Aug. 27, 2021 (JP) ................. 2021-138856

(51) Int. Cl.
G03F 1/26 (2012.01)
G03F 1/24 (2012.01)
G03F 1/48 (2012.01)
G03F 1/80 (2012.01)

(52) U.S. Cl.
CPC ............... *G03F 1/26* (2013.01); *G03F 1/24* (2013.01); *G03F 1/48* (2013.01); *G03F 1/80* (2013.01)

(58) Field of Classification Search
CPC ..... G03F 1/24; G03F 1/26; G03F 1/48; G03F 1/80

USPC .......................................................... 430/5
See application file for complete search history.

(56) References Cited

U.S. PATENT DOCUMENTS

| | | |
|---|---|---|
| 11,829,065 B2 * | 11/2023 | Taki .................... G03F 1/54 |
| 2021/0208498 A1 | 7/2021 | Ikebe et al. |
| 2022/0121105 A1 | 4/2022 | Van Lare et al. |
| 2022/0390826 A1 | 12/2022 | Ikebe et al. |

FOREIGN PATENT DOCUMENTS

| | | |
|---|---|---|
| JP | 2007-273678 A | 10/2007 |
| JP | 5233321 B2 | 7/2013 |
| JP | WO 2019/225736 A1 | 11/2019 |
| JP | 2020-106639 A | 7/2020 |
| JP | WO 2020/160851 A1 | 8/2020 |
| JP | WO 2021/100383 A1 | 5/2021 |
| KR | 2021-0013008 A | 2/2021 |
| KR | 2021-0038360 A | 4/2021 |

OTHER PUBLICATIONS

International Search Report dated Nov. 1, 2023, in PCT/JP2022/030631 (10 pages).
Written Opinion of International Searching Authority (WO/ISA) mailed on Nov. 1, 2022, in PCT/JP2022/030631 (with English Translation).
Written Opinion of International Searching Authority (PCT/ISA/237) mailed on Nov. 1, 2022, in PCT/JP2022/030631 (with its entire translation).

* cited by examiner

*Primary Examiner* — Christopher G Young
(74) *Attorney, Agent, or Firm* — Oblon, McClelland, Maier & Neustadt, L.L.P.

(57) ABSTRACT

A reflective mask blank containing a substrate, a multilayer reflective film that reflects EUV light, and a phase shift film that shifts a phase of the EUV light, the substrate, the multilayer reflective film, and the phase shift film being arranged in this order. The phase shift film contains a compound containing Ru and Cr, an element ratio between Cr and Ru (Cr:Ru) in the phase shift film is 5:95 to 42:58, and a melting point MP1 of an oxide of the compound and a melting point MP2 of a fluoride or an oxyfluoride of the compound satisfy the following relation (1):

$$0.625 MP1 + MP2 \leq 1000 \qquad (1).$$

18 Claims, 7 Drawing Sheets

REFLECTIVE MASK BLANK, REFLECTIVE MASK, METHOD OF MANUFACTURING REFLECTIVE MASK BLANK, AND METHOD OF MANUFACTURING REFLECTIVE MASK

CROSS-REFERENCE TO RELATED APPLICATION

The present application is a continuation of U.S. application Ser. No. 18/193,674, filed on Mar. 31, 2023, which is a continuation application of International Application No. PCT/JP2022/030631, filed Aug. 10, 2022, which claims priority to Japanese Patent Application No. 2021-138856 filed Aug. 27, 2021. The contents of these applications are incorporated herein by reference in their entirety.

BACKGROUND OF THE INVENTION

1. Field of the Invention

The disclosure herein generally relates to a reflective mask blank, a reflective mask, a method of manufacturing a reflective mask blank, and a method of manufacturing a reflective mask.

2. Description of the Related Art

Along with the recent miniaturization of semiconductor devices, EUV lithography (EUVL), an exposure technology using Extreme Ultra-Violet (EUV) light, has been developed. The EUV light includes a soft X-ray and a vacuum ultraviolet light, and specifically has a wavelength of from 0.2 nm to 100 nm. At present, EUV light with a wavelength of about 13.5 nm is mainly studied.

In the EUVL, a reflective mask is used. The reflective mask includes a substrate, such as a glass substrate, a multilayer reflective film formed on the substrate, and a phase shift film formed on the multilayer reflective film. An opening pattern is formed in the phase shift film. In the EUVL, the opening pattern of the phase shift film is transferred to a target substrate, such as a semiconductor substrate. The transferring includes transferring a reduced opening pattern.

The phase shift film of Example 1 of Japanese Patent No. 5233321 contains a compound in which a composition ratio between Ta and Ru is 2:1. The phase shift film of Example 2 of Japanese Patent No. 5233321 contains a compound in which a composition ratio among Ta, N, and Ru is 2:2:1.

SUMMARY OF THE INVENTION

Problem to be Solved by the Invention

Conventionally, a chemical composition and a structure of the phase shift film for the EUVL have been studied.

An aspect of the present disclosure provides a technique for lowering a refractive index of a phase shift film and improving processability of the phase shift film.

Means for Solving the Problem

According to an aspect of the present disclosure, a reflective mask blank includes a substrate; a multilayer reflective film that reflects EUV light; and a phase shift film that shifts a phase of the EUV light, in this order. The phase shift film contains a compound containing Ru and an element X2 different from Ru. A melting point MP1 of an oxide of the compound and a melting point MP2 of a fluoride or an oxyfluoride of the compound satisfy a formula (1).

[Equation 1]

$$0.625 MP1 + MP2 \leq 1000. \qquad (1)$$

Effects of the Invention

According to an aspect of the present disclosure, by forming the phase shift film with the Ru compound satisfying the above formula (1), it is possible to lower the refractive index of the phase shift film and improve the processability of the phase shift film.

BRIEF DESCRIPTION OF THE DRAWINGS

Other objects and further features of the present disclosure will be apparent from the following detailed description when read in conjunction with the accompanying drawings, in which.

DESCRIPTION OF THE EMBODIMENT

Figure 1:
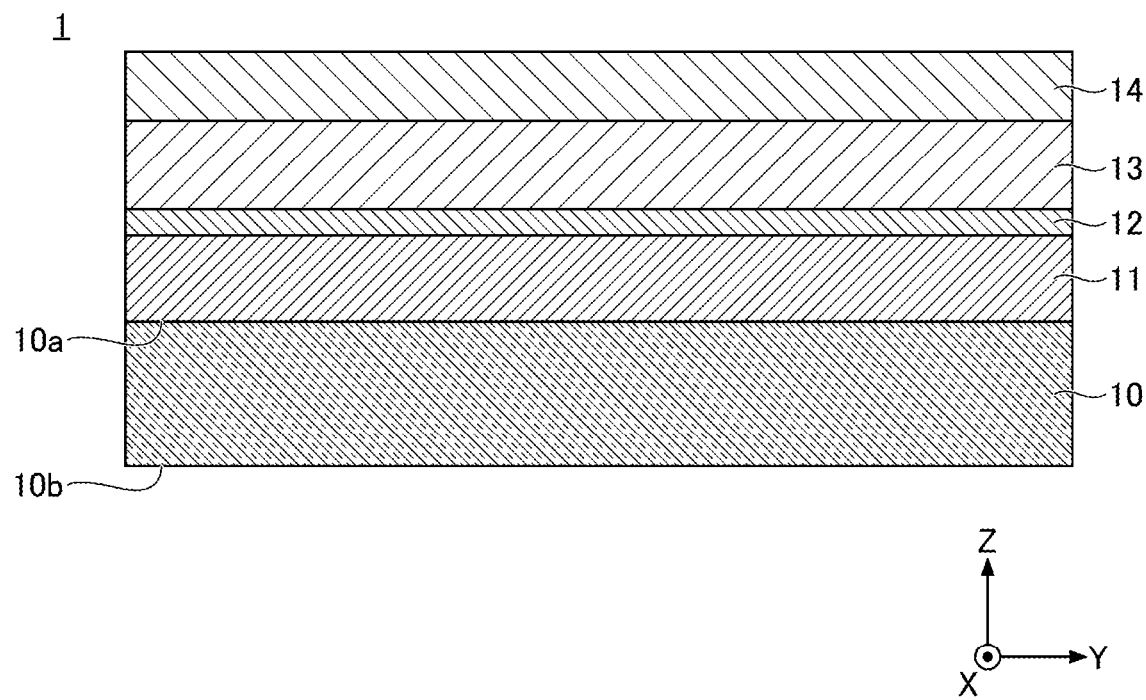
FIG. 1 is a cross-sectional view showing a reflective mask blank according to an embodiment.

In the following, embodiments of the present disclosure will be described with reference to the accompanying drawings. In each drawing, to the same or corresponding configurations, the same reference numeral will be assigned, and an explanation may be omitted. In the specification, a symbol "-" representing a numerical range indicates that values before and after the symbol are included as a lower limit value and an upper limit value, respectively.

Figure 2:
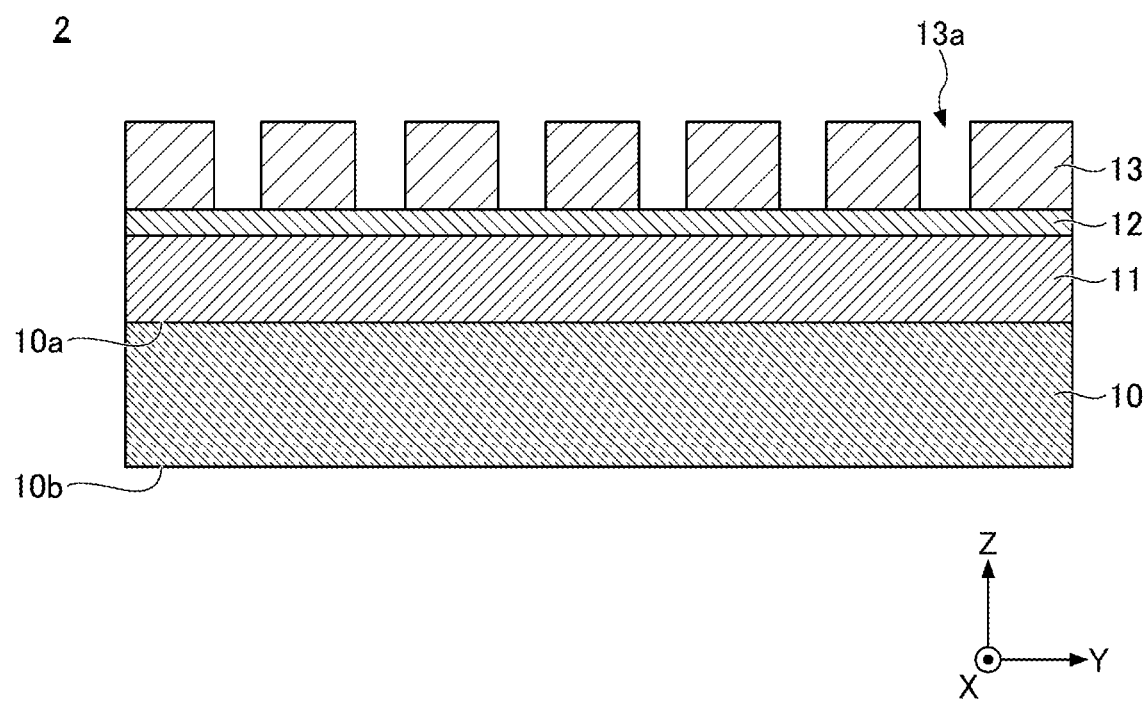
FIG. 2 is a cross-sectional view showing a reflective mask according to the embodiment.
Figure 3:
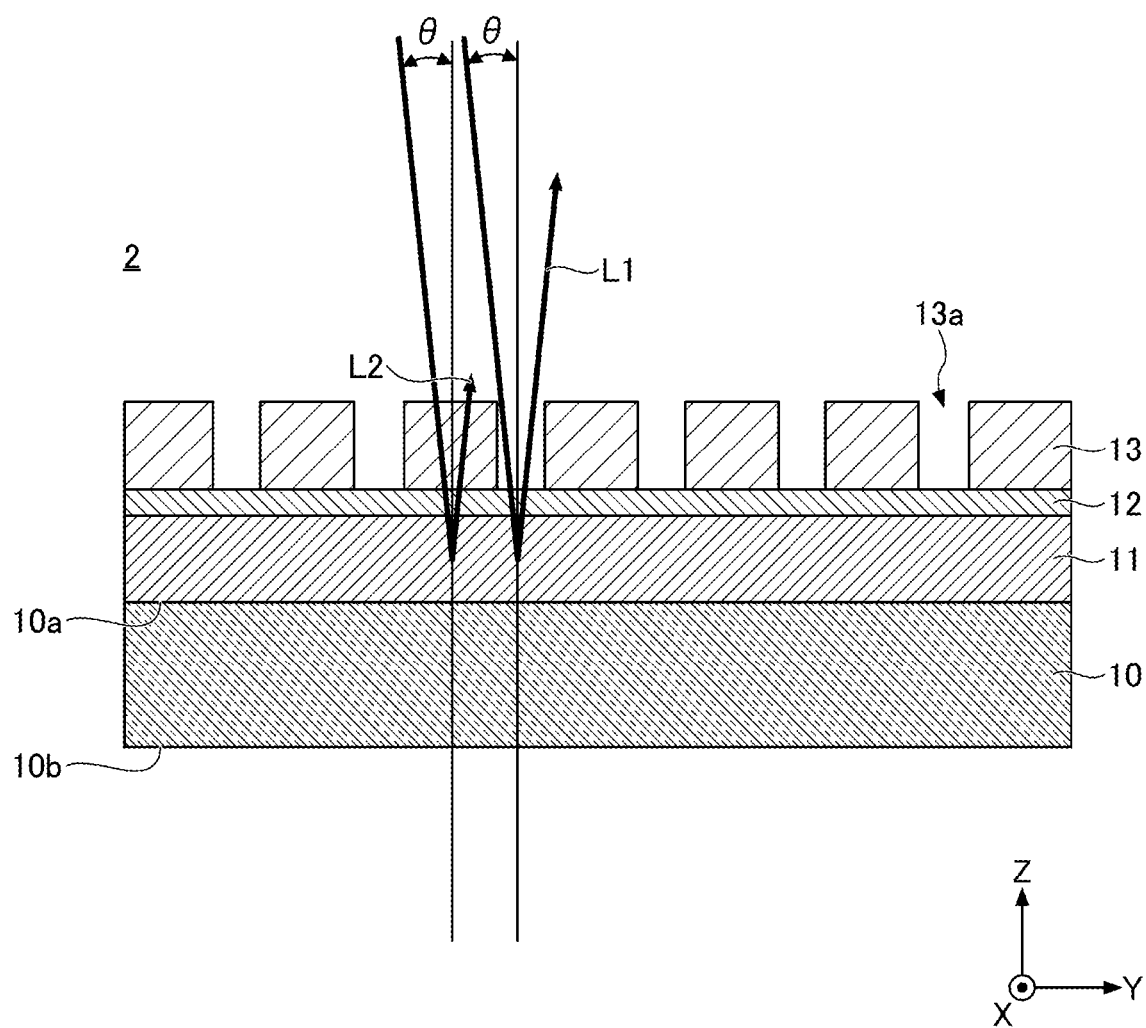
FIG. 3 is a cross-sectional view of the reflective mask for illustrating an example of EUV light reflected by the reflective mask of FIG. 2.

In FIGS. 1 to 5, an X-axis direction, a Y-axis direction, and a Z-axis direction are directions orthogonal to each other. The Z-axis direction is a direction perpendicular to a first main surface 10a of a substrate 10. The X-axis direction is a direction perpendicular to an incident plane of EUV light (a plane including an incident light beam and a reflected light beam). As shown in FIG. 3, when viewed from the X-axis direction, the incident light beam and the reflected light beam are inclined towards the Y-axis direction on propagating in the Z-axis direction. That is, as shown in FIG. 3, the incident light beam is inclined towards the Y-axis positive direction on propagating in the Z-axis negative direction, and the reflected light beam is inclined towards the Y-axis positive direction on propagating in the Z-axis positive direction.

A reflective mask blank 1 according to an embodiment will be described with reference to FIG. 1. The reflective mask blank 1 includes, for example, the substrate 10; a multilayer reflective film 11; a protection film 12; a phase shift film 13; and an etching mask film 14, in this order. The multilayer reflective film 11, the protection film 12, the phase shift film 13, and the etching mask film 14 are formed in this order on the first main surface 10a of the substrate 10. The reflective mask blank 1 only needs to have at least the substrate 10, the multilayer reflective film 11, and the phase shift film 13.

The reflective mask blank 1 may further have a functional film, which is not shown in FIG. 1. For example, the reflective mask blank 1 may have a conductive film on the side opposite to the multilayer reflective film 11 with respect to the substrate 10. The conductive film may be used, for example, to attract a reflective mask 2 to an electrostatic chuck of an exposure apparatus. The reflective mask blank 1 may have a diffusion barrier film (not shown) between the multilayer reflective film 11 and the protection film 12. The diffusion barrier film prevents metal elements contained in the protection film 12 from diffusing into the multilayer reflective film 11.

Figure 4:
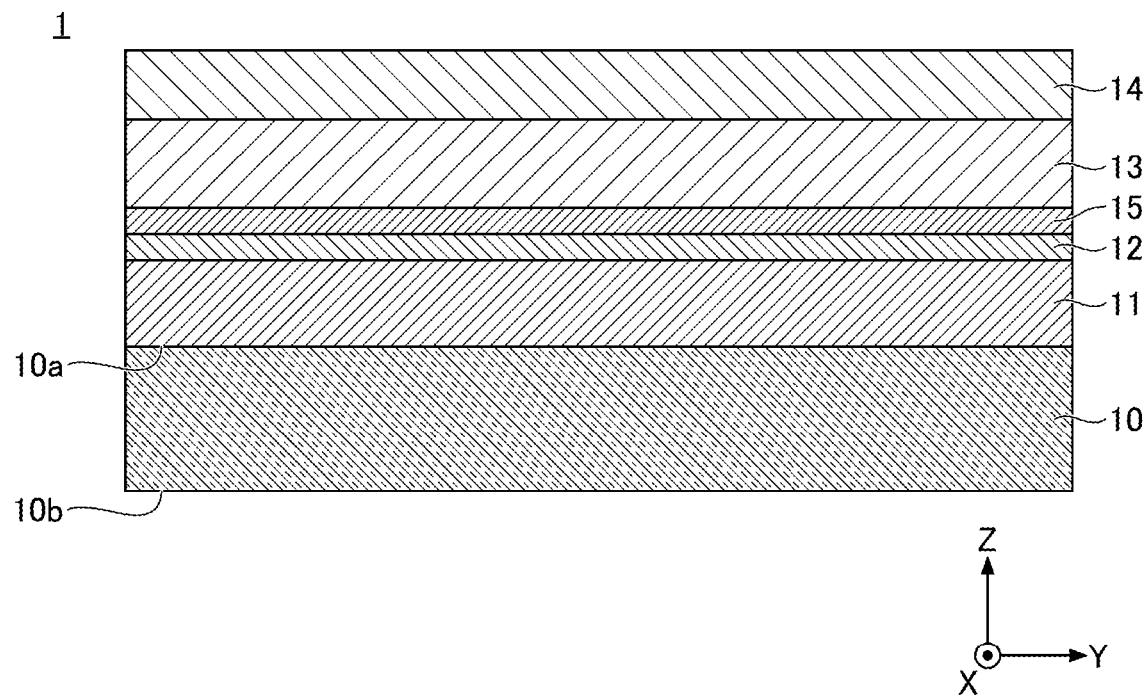
FIG. 4 is a cross-sectional view showing a reflective mask blank according to a variation of the embodiment.
Figure 5:
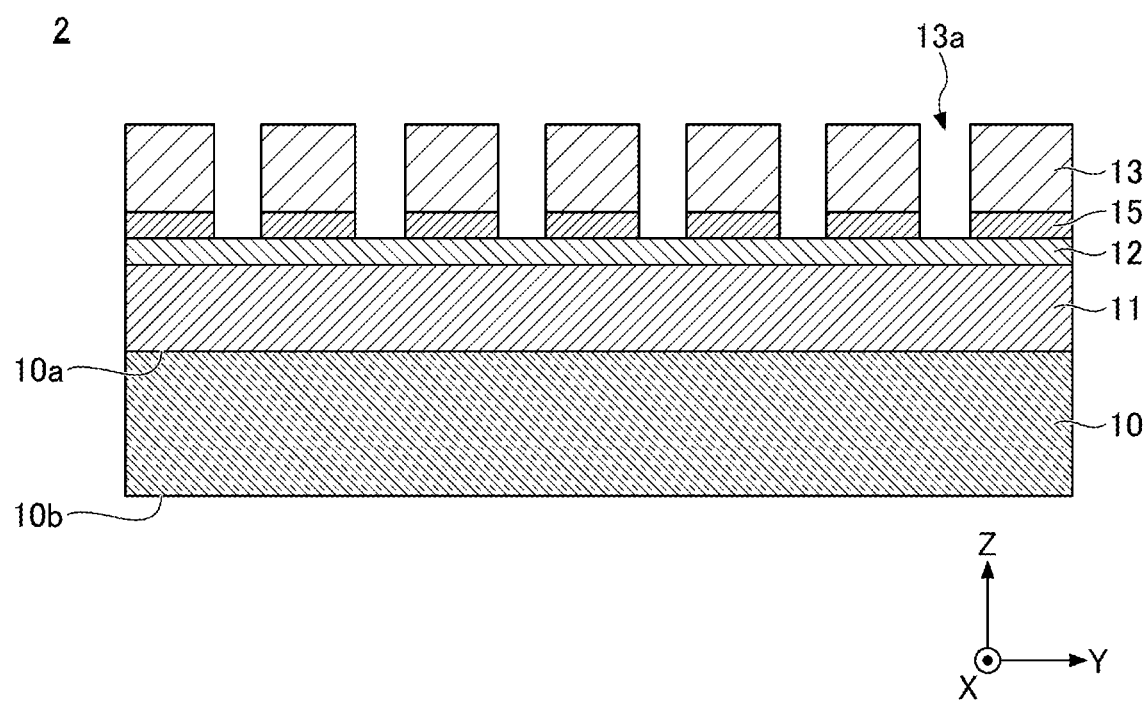
FIG. 5 is a cross-sectional view showing a reflective mask according to the variation of the embodiment.

As shown in FIG. 4, the reflective mask blank 1 may have a buffer film 15 between the protection film 12 and the phase shift film 13. The buffer film 15 protects the protection film 12 from an etching gas for forming an opening pattern 13a in the phase shift film 13. The buffer film 15 is etched more gently than the phase shift film 13. Finally, the buffer film 15 has the same opening pattern as the opening pattern 13a of the phase shift film 13 as shown in FIG. 5.

Next, the reflective mask 2 according to the embodiment will be described with reference to FIGS. 2 and 3.

The reflective mask 2 is manufactured using, for example, the reflective mask blank 1 shown in FIG. 1, and includes the opening pattern 13a in the phase shift film 13. The etching mask film 14 shown in FIG. 1 is removed after the opening pattern 13a is formed in the phase shift film 13.

In EUVL, the opening pattern 13a of the phase shift film 13 is transferred to a target substrate, such as a semiconductor substrate. The transferring includes transferring a reduced opening pattern. In the following, the substrate 10, the multilayer reflective film 11, the protection film 12, the phase shift film 13, and the etching mask film 14 will be described in this order.

The substrate 10 is, for example, a glass substrate. A material of the substrate 10 is preferably quartz glass containing $TiO_2$. Compared with general soda lime glass, a linear expansion coefficient of the quartz glass is small, and thereby a dimensional change due to a temperature change is small. The quartz glass may contain 80 mass %-95 mass % of $SiO_2$ and 4 mass %-17 mass % of $TiO_2$. When the $TiO_2$ content is 4 mass %-17 mass %, the linear thermal expansion coefficient around room temperature is substantially zero, and almost no dimensional change around room temperature occurs. The quartz glass may contain a third component or impurity other than $SiO_2$ and $TiO_2$. The material of the substrate 10 may be crystallized glass in which a β-quartz solid solution is precipitated, silicon, metal, or the like.

The substrate 10 has the first main surface 10a and a second main surface 10b opposite to the first main surface 10a. The multilayer reflective film 11 and the like are formed on the first main surface 10a. The size of the substrate in a plan view (viewed in the Z-axis direction) is, for example, 152 mm longitudinally and 152 mm laterally. The longitudinal and lateral dimensions may be greater than or equal to 152 mm. Each of the first main surface 10a and the second main surface 10b has, for example, a square-shaped quality-guaranteed region at the center thereof. The size of the quality-guaranteed region is, for example, 142 mm longitudinally and 142 mm laterally. The quality-guaranteed region on the first main surface 10a preferably has a root mean square roughness Rq of 0.15 nm or less and a flatness of 100 nm or less. The quality-guaranteed region of the first main surface 10a is preferably free from a defect that may cause a phase defect.

The multilayer reflective film 11 reflects EUV light. The multilayer reflective film 11 is formed by alternately stacking, for example, a high refractive index layer and a low refractive index layer. A material of the high refractive index layer is, for example, silicon (Si), and a material of the low refractive index layer is, for example, molybdenum (Mo). With this combination, the multilayer reflective film is a Mo/Si multilayer reflective film. In addition, a Ru/Si multilayer reflective film, a Mo/Be multilayer reflective film, a Mo compound/Si compound multilayer reflective film, a Si/Mo/Ru multilayer reflective film, a Si/Mo/Ru/Mo multilayer reflective film, a Si/Ru/Mo/Ru multilayer reflective film, or the like can also be used as the multilayer reflective film 11.

The film thickness of each layer constituting the multilayer reflective film 11 and the number of repeating units of layers can be appropriately selected according to the material of each layer and a reflectance to EUV light. When the multilayer reflective film 11 is a Mo/Si multilayer reflective film, in order to achieve a reflectance of 60% or more with respect to EUV light having an incident angle θ (see FIG. 3) of 6°, a Mo layer having a film thickness of 2.3±0.1 nm and a Si layer having a film thickness of 4.5±0.1 nm may be stacked so that the number of repeating units is 30 or more and 60 or less. The multilayer reflective film 11 preferably has the reflectance of 60% or more to EUV light at an incident angle θ of 6°. The reflectance is more preferably 65% or more.

The method of forming each layer constituting the multilayer reflective film 11 is, for example, a DC sputtering method, a magnetron sputtering method, or an ion beam sputtering method. For example, film formation conditions for each of the Mo layer and the Si layer, when a Mo/Si multilayer reflective film is formed by the ion beam sputtering method, will be shown as follows.

<Film Formation Condition for Si Layer>
  Target: Si;
  Sputtering gas: Ar;
  Gas pressure: $1.3 \times 10^{-2}$ Pa-$2.7 \times 10^{-2}$ Pa;
  Ion acceleration voltage: 300 V-1500 V;
  Film formation rate: 0.030 nm/sec-0.300 nm/sec; and
  Film thickness of Si layer: 4.5±0.1 nm.
<Film Formation Condition for Mo Layer>
  Target: Mo;
  Sputtering gas: Ar;
  Gas pressure: $1.3 \times 10^{-2}$ Pa-$2.7 \times 10^{-2}$ Pa;
  Ion acceleration voltage: 300 V-1500 V;
  Film formation rate: 0.030 nm/sec-0.300 nm/sec; and
  Film thickness of Mo layer: 2.3±0.1 nm
<Repeating Unit of Si Layer and Mo Layer>
  Number of repeating units: 30-60 (preferably 40-50).

The protection film 12 is formed between the multilayer reflective film 11 and the phase shift film 13, to protect the multilayer reflective film 11 from the etching gas. The etching gas is used to form the opening pattern 13a (see FIG.

2) in the phase shift film 13. The etching gas is, for example, a mixed gas of a fluorine-based gas and an oxygen-based gas.

The fluorine-based gas is, for example, a $CF_4$ gas, a $CHF_3$ gas, a $SF_6$ gas, a $BF_3$ gas, a $XeF_2$ gas, or a mixture of these gases. The oxygen-based gas is, for example, an $O_2$ gas, an $O_3$ gas, a $CO_2$ gas, a $NO_2$ gas, a $SO_2$ gas, a $H_2O$ gas, or a mixture gas thereof. A volume ratio between the oxygen-based gas and the fluorine-based gas, (oxygen-based gas):(fluorine-based gas), is preferably 10:90-50:50, more preferably 20:80-40:60.

A ratio (ER2/ER1) of an etching rate ER1 of etching the phase shift film 13 using the etching gas to an etching rate ER2 of etching the protection film 12 using the etching gas is also referred to as a first selection ratio. The higher the first selection ratio is, the better the processability of the phase shift film 13 is.

When the buffer film 15 is not present between the protection film 12 and the phase shift film 13 as shown in FIGS. 1 and 2, the first selection ratio is preferably 10 or more, and more preferably 30 or more. The first selection ratio is preferably 200 or less, and more preferably 100 or less.

When the buffer film 15 is not present, the protection film 12 preferably contains rhodium (Rh). Alternatively, the protection film preferably contains 50 at % or more of Rh and at least one element X1 selected from the group consisting of ruthenium (Ru), silicon (Si), aluminum (Al), hafnium (Hf), yttrium (Y), tantalum (Ta), niobium (Nb), molybdenum (Mo), and iridium (Ir). According to the above-described contents, the first selection ratio can be made 10 or more.

In the case where the protection film 12 contains Ru, Nb, Mo, or Y, an extinction coefficient of the protection film 12 can be reduced without greatly increasing the refractive index of the protection film 12, so that the reflectance for EUV light can be improved. When the protection film 12 contains Ru, Ta, Ir, or Y, resistance to the etching gas and resistance to a sulfuric acid-hydrogen peroxide mixture can be improved. The element X1 is preferably Ru, Nb, Mo, or Y.

An element ratio between the element X1 and rhodium (Rh), X1:Rh, is preferably 1:99-1:1. In the specification of the present application, the element ratio means a molar ratio. When the value of the ratio X1/Rh is 1/99 or more, the reflectance for EUV light is excellent. When the value of the ratio X1/Rh is less than or equal to 1, the resistance of the protection film 12 to the etching gas is excellent. The element ratio between X1 and Rh, X1:Rh, is more preferably 3:10-1:1.

The protection film 12 may contain, in addition to rhodium (Rh), at least one element Y1 selected from the group consisting of nitrogen (N), oxygen (O), carbon (C), and boron (B). Although the element Y1 reduces the resistance of the protection film 12 to the etching gas, the element Y1 improves the smoothness of the protection film 12 according to reduction of crystallinity of the protection film 12. The protection film 12 containing the element Y1 has a non-crystalline structure or a microcrystalline structure. When the protection film 12 has a non-crystalline structure or a microcrystalline structure, the X-ray diffraction profile of the protection film 12 does not exhibit a clear peak.

When the protection film 12 contains Y1 in addition to Rh, it is preferable that the content of Rh or the total content of Rh and X1 is 40 at %-99 at %, and the total content of Y1 is 1 at %-60 at %. When the protection film 12 contains Y1 in addition to Rh, it is more preferable that the content of Rh or the total content of Rh and X1 is 80 at %-99 at %, and the total content of Y1 is 1 at %-20 at %.

When the protection film 12 contains 90 at % or more of Rh, contains X1, Y1, or both, and has a film density of 10.0 $g/cm^3$–14.0 $g/cm^3$, the protection film 12 has a non-crystalline structure or a microcrystalline structure. The film density of the protection film 12 is preferably 11.0 $g/cm^3$-13.0 $g/cm^3$. When the protection film 12 contains 100 at % of Rh and has the film density of 11.0 $g/cm^3$-12.0 $g/cm^3$, the protection film 12 has a non-crystalline structure or a microcrystalline structure. The film density of the protection film 12 is measured using an X-ray reflectance method.

When the buffer film 15 is present between the protection film 12 and the phase shift film 13 as shown in FIGS. 4 and 5, the first selection ratio only needs to be greater than 1.0, and the protection film 12 may be, for example, a Ru film or a SiO film. When the protection film 12 is a Ru film or a SiO film, the first selection ratio is less than 3.0.

In the case where the buffer film 15 is present, the processability of the phase shift film 13 is expressed by a second selection ratio, which will be described below. The second selection ratio is a ratio of the etching rate ER1 of etching the phase shift film 13 using the etching gas to an etching rate ER3 of etching the buffer film 15 using the etching gas, i.e., ER3/ER1. The higher the second selection ratio is, the better the processability of the phase shift film 13 is. The second selection ratio is preferably 3.0 or more. The second selection ratio is preferably 200 or less, and more preferably 100 or less.

The buffer film 15 preferably contains tantalum (Ta). Alternatively, the buffer film preferably contains, in addition to Ta, at least one element selected from the group consisting of oxygen (O) and nitrogen (N). When the buffer film 15 contains tantalum nitride (TaN) or tantalum oxynitride (TaON), the second selection ratio is 3.0 or more, which will be described in detail in the section of Examples.

The film thickness of the buffer film 15 is preferably 1.0 nm or more and 10 nm or less. When the film thickness of the buffer film 15 is 1.0 nm or more, the buffer film 15 can protect the protection film 12. When the film thickness of the buffer film 15 is 10 nm or less, the film thickness of the phase shift film 13 can be increased while suppressing an increase in a shadowing effect, which will be described below, and thereby a sufficient phase shift effect can be obtained.

The description returns to the protection film 12. The protection film 12 has resistance to sulfuric acid-hydrogen peroxide mixture (SPM), which is a cleaning liquid, and protects the multilayer reflective film 11 from the sulfuric acid-hydrogen peroxide mixture. The sulfuric acid-hydrogen peroxide mixture is used, for example, to remove a resist film (not shown) or to clean the reflective mask 2. The resist film is formed on the etching mask film 14 (or on the phase shift film 13 when the etching mask film 14 is not present).

The film thickness of the protection film 12 is preferably 1.0 nm or more and 10.0 nm or less, and more preferably 2.0 nm or more and 3.5 nm or less.

The root mean square roughness Rq of the protection film 12 is preferably 0.3 nm or less, and more preferably 0.1 nm or less.

The method of forming the protection film 12 includes, for example, a DC sputtering method, a magnetron sputtering method, or an ion beam sputtering method. For example, film formation conditions, when a Rh film is formed by the DC sputtering method, will be shown as follows.

<Film Formation Conditions for Rh Film>
  Target: Rh;
  Sputtering gas: Ar;
  Gas pressure: $1.0\times10^{-2}$ Pa–$1.0\times10^{0}$ Pa;
  Input power density per unit area of target: 1.0 W/cm$^2$-8.5 W/cm$^2$;
  Film formation rate: 0.020 nm/sec-1.000 nm/sec; and
  Film thickness of Rh film: 1 nm-10 nm.

When the Rh film is formed, a N$_2$ gas or a mixture gas of an Ar gas and a N$_2$ gas may be used as the sputtering gas. The volume ratio of a N$_2$ gas in the sputtering gas, N$_2$/(Ar+N$_2$), is 0.05 or more and 1.0 or less.

For example, film formation conditions, when a RhO film is formed by the DC sputtering method, will be shown as follows.

<Film Formation Conditions for Rho Film>
  Target: Rh;
  Sputtering gas: an O$_2$ gas, or a mixture gas of an Ar gas and an O$_2$ gas;
  Volume ratio of an O$_2$ gas in sputtering gas, O$_2$/(Ar+O$_2$)): 0.05-1.0;
  Gas pressure: $1.0\times10^{-2}$ Pa-$1.0\times10^{0}$ Pa;
  Input power density per unit area of target: 1.0 W/cm$^2$-8.5 W/cm$^2$;
  Film formation rate: 0.020 nm/sec-1.000 nm/sec; and
  Film thickness of RhO film: 1 nm-10 nm.

For example, film formation conditions, when a RhRu film is formed by the DC sputtering method, will be shown as follows.

<Film Formation Conditions for RhRu Film>
  Target: Rh and Ru (or RhRu);
  Sputtering gas: Ar;
  Gas pressure: $1.0\times10^{-2}$ Pa-$1.0\times10^{0}$ Pa;
  Input power density per unit area of target: 1.0 W/cm$^2$-8.5 W/cm$^2$;
  Film formation rate: 0.020 nm/sec-1.000 nm/sec; and
  Film thickness of RhRu film: 1 nm-10 nm.

The phase shift film 13 is a film in which the opening pattern 13a is to be formed. The opening pattern 13a is not formed in the manufacturing process of the reflective mask blank 1 but is formed in the manufacturing process of the reflective mask 2. The phase shift film 13 shifts a phase of second EUV light L2 with respect to a phase of first EUV light L1 shown in FIG. 3.

The first EUV light L1 is light that entered and passed through the opening pattern 13a without passing through the phase shift film 13, was reflected by the multilayer reflective film 11, and passed through the opening pattern 13a without passing through the phase shift film 13 again and exited. The second EUV light L2 is light that entered and passed through the phase shift film 13 while being absorbed by the phase shift film 13, was reflected by the multilayer reflective film 11, and passed through the phase shift film 13 while being absorbed again by the phase shift film 13 and exited.

The phase shift, which is greater than or equal to zero, between the first EUV light L1 and the second EUV light L2 is, for example, 200°-250°. The phase of the first EUV light L1 may be advanced or retarded from the phase of the second EUV light L2. The phase shift film 13 improves a contrast of a transferred image by utilizing an interference between the first EUV light L1 and the second EUV light L2. The transferred image is an image obtained by transferring the opening pattern 13a of the phase shift film 13 to a target substrate.

As the film thickness of the phase shift film 13 becomes smaller, a projection effect (shadowing effect) is reduced. The shadowing effect means that, for example, as shown in FIG. 3, a region that shields EUV light due to a non-zero incident angle (e.g., 6°) appears near an opening edge of the opening pattern 13a on the surface of the phase shift film 13, and the size of the transferred image deviates from the desired size. The smaller the film thickness of the phase shift film 13 is, the better the processing accuracy of the opening pattern 13a is.

In order to reduce the projection effect, the film thickness of the phase shift film 13 is, for example, 50 nm or less, preferably 45 nm or less, and more preferably 35 nm or less. In order to secure the phase difference between the first EUV light L1 and the second EUV light L2, the film thickness of the phase shift film 13 is preferably nm or more, and more preferably 20 nm or more.

In order to reduce the film thickness of the phase shift film 13 so as to reduce the projection effect while securing the phase difference between the first EUV light L1 and the second EUV light L2, it is effective to reduce the refractive index of the phase shift film 13, and it is effective that the phase shift film 13 contains ruthenium (Ru). The refractive index of Ru alone is 0.893. However, Ru decreases the first selection ratio and the second selection ratio. As a result, the processability of the phase shift film 13 may deteriorate.

The inventors of the present application studied a Ru compound as a material of the phase shift film 13. The Ru compound is generally etched using a mixture gas of a chlorine-based gas and an oxygen-based gas, for example, a mixture gas of a Cl$_2$ gas and an O$_2$ gas. The inventors of the present application examined the relationship between an etching rate for the Ru compound by the mixture gas of a Cl$_2$ gas and an O$_2$ gas and the ratio of an element X2 to the Ru compound. The element X2 is an element different from Ru, and is, for example, a metallic element or a metalloid element.

Figure 9:
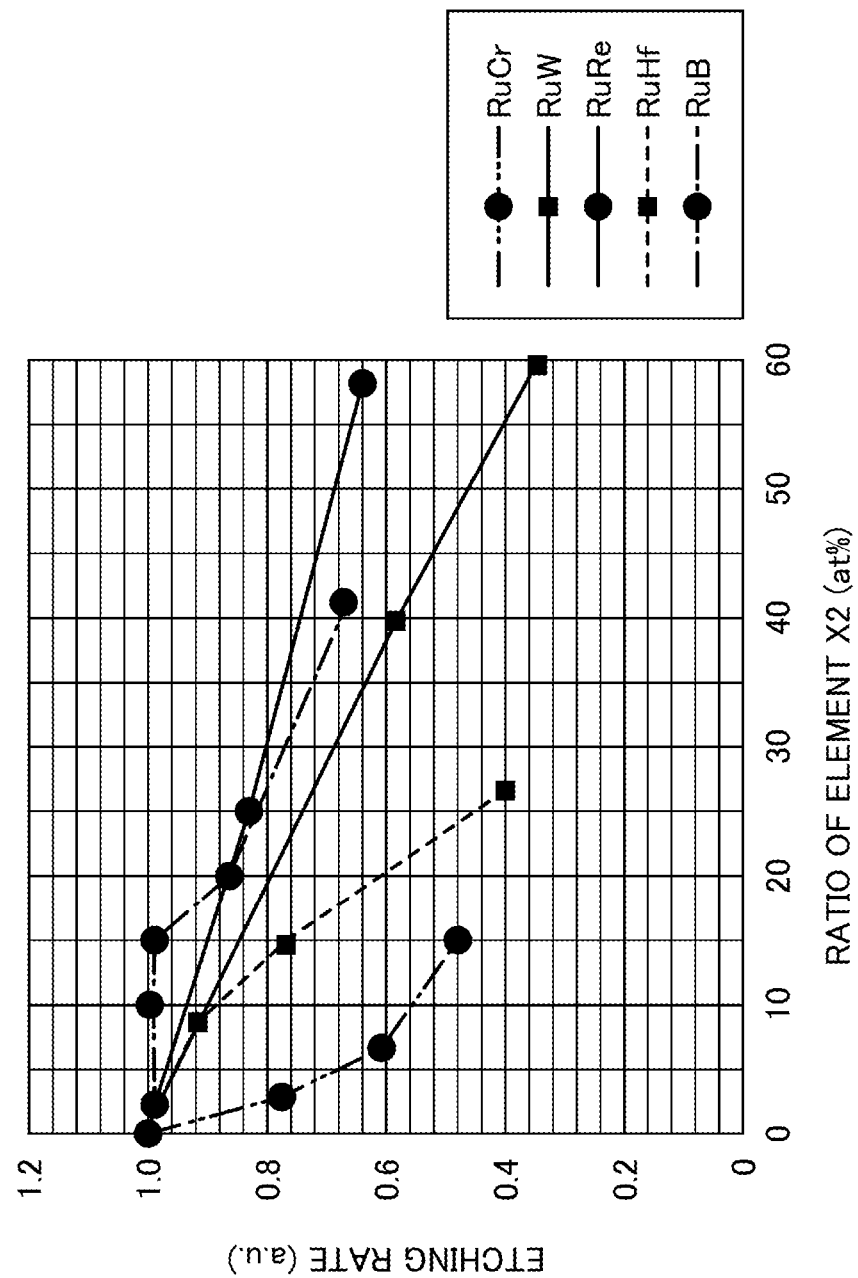
FIG. 9 is a diagram showing an example of a relationship between an etching rate for the Ru compound by a mixture gas of a $Cl_2$ gas and an $O_2$ gas and a ratio of an element X2 to the Ru compound.

FIG. 9 shows an example of the relationship between the etching rate for the Ru compound by the mixture gas of a Cl$_2$ gas and an O$_2$ gas and the ratio of the element X2 to the Ru compound. The etching rate for the Ru compound was normalized by an etching rate for Ru alone. As the ratio of the element X2 to the Ru compound increases, the etching rate for the Ru compound decreases. Thus, the etching rate could not be increased by using the Ru compound instead of Ru alone.

Next, the inventors of the present application studied etching of the Ru compound by using a mixed gas of a fluorine-based gas and an oxygen-based gas. The fluorine-based gas removes the Ru compound by fluorinating the Ru compound and volatilizing the fluoride. The oxygen-based gas removes the Ru compound by oxidizing the Ru compound and volatilizing the oxide. The fluorine-based gas and the oxygen-based gas remove the Ru compound by fluorinating, oxidizing, or oxyfluorinating the Ru compound and volatilizing the fluoride, oxide, or oxyfluoride.

The inventors of the present application focused on a melting point MP1 of an oxide of a Ru compound and a melting point MP2 of a fluoride or an oxyfluoride of a Ru compound. It is considered that the lower the melting point MP1, the more easily the oxide volatilizes and the higher the etching rate becomes. Similarly, it is considered that the lower the melting point MP2 is, the more easily the fluoride or oxyfluoride is volatilized and the higher the etching rate becomes. Since the volatilization of the oxyfluoride occurs preferentially to the volatilization of the fluoride, the melting point of the oxyfluoride is adopted as the melting point MP2 when the oxyfluoride is generated.

As will be described in detail in EXAMPLES, the inventors of the present application have found through experiments that the etching rate for the phase shift film 13 can be increased and the processability of the phase shift film 13 can be improved by forming the phase shift film 13 with a Ru compound having melting points MP1 and MP2 satisfying the following formula (1).

[Equation 2]

$$0.625 MP1 + MP2 \leq 1000. \quad (1)$$

Moreover, as will be described in detail in EXAMPLES, the inventors of the present application have found through experiments that the etching rate for the phase shift film 13 can be further increased and the processability of the phase shift film 13 can be further improved by forming the phase shift film 13 with a Ru compound having melting points MP1 and MP2 satisfying both the above formula (1) and the following formula (2).

[Equation 3]

$$-0.500 MP1 + MP2 \leq 400. \quad (2)$$

Figure 6:
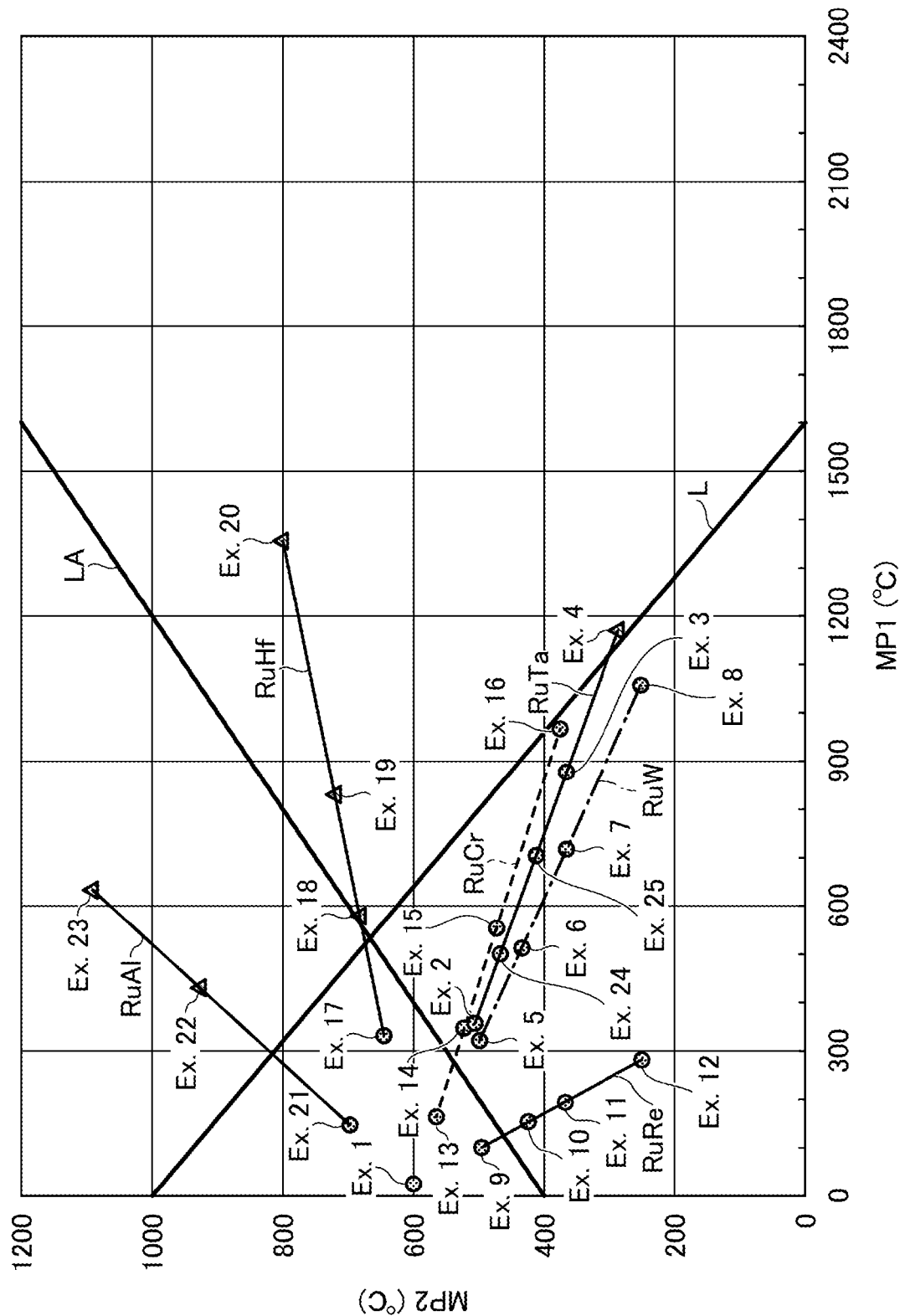
FIG. 6 is a diagram showing a relationship among melting points MP1 and MP2 shown in TABLE 1, a formula (1), and a formula (2)

FIG. 6 shows relationships between pairs of the melting points MP1 and MP2, and the formula (1), and a relationship between the pairs and the formula (2). The pairs of the melting points will be shown in TABLE 1 in EXAMPLES. In FIG. 6, a straight-line L represents a boundary between a region where the formula (1) is satisfied and a region where the formula (1) is not satisfied. Examples 2, 3, 5 to 17, 21, 24, and 25 are examples of the Ru compound that satisfies the formula (1). On the other hand, Examples 4, 18 to 20, and 22 to 23 are examples of the Ru compound that does not satisfy the formula (1). Note that Example 1 is an example of Ru alone.

In FIG. 6, a straight-line LA represents a boundary between a region where the above-described formula (2) is satisfied and a region where the above-described formula (2) is not satisfied. Examples 2, 3, 5 to 8, 10 to 12, 14 to 16, 24, and 25 are examples of the Ru compound that satisfies both the formula (1) and the formula (2). On the other hand, Examples 9, 13, 17, and 21 are examples of the Ru compound that satisfies the formula (1) but does not satisfy the formula (2).

The phase shift film 13 contains a compound containing Ru and X2. The element X2 is an element different from Ru, and is, for example, a metallic element or a metalloid element. The phase shift film 13 preferably contains at least one element selected from the group consisting of Ta, W, Re, and Cr as the element X2. The phase shift film 13 more preferably contains at least one element selected from the group consisting of Ta, W, and Re as the element X2.

When the phase shift film 13 contains Ta as the element X2, an element ratio between Ta and Ru (Ta:Ru) is, for example, 1:99-1:1. When the element ratio Ta:Ru is 1:99-1:1, the above formula (1) is satisfied, and an etching rate higher than that of Ru alone is obtained. When a value of the ratio (Ta/Ru) is 1/1 or less, a RuTa film having a refractive index of 0.925 or less and high resistance to a sulfuric acid-hydrogen peroxide mixture can be obtained. When the value of the ratio (Ta/Ru) is less than 1/99, an etching rate higher than that of Ru cannot be obtained. When the value of the ratio (Ta/Ru) is 52/48 or more, a RuTa film having a refractive index of 0.926 or more is obtained. The element ratio between Ta and Ru (Ta:Ru) is preferably 1:99-1:1, more preferably 5:95-1:1, and even more preferably 1:9-1:1.

When the phase shift film 13 contains W as the element X2, the element ratio between W and Ru (W:Ru) is, for example, 1:99-1:1. When the element ratio W:Ru is 1:99-1:1, the above formula (1) is satisfied, and an etching rate higher than that of Ru alone is obtained. When a value of the ratio (W/Ru) is 1/1 or less, a RuW film having a refractive index of 0.925 or less and high resistance to a sulfuric acid-hydrogen peroxide mixture can be obtained. The element ratio between W and Ru (W:Ru) is preferably 1:99-1:1, more preferably 5:95-1:1, and even more preferably 1:9-1:1.

When the phase shift film 13 contains Re as the element X2, the element ratio between Re and Ru (Re:Ru) is, for example, 1:99-1:1. When the element ratio Re:Ru is 1:99-1:1, the above formula (1) is satisfied, and an etching rate higher than that of Ru alone is obtained. When a value of the ratio (Re/Ru) is 1/1 or less, a RuRe film having a refractive index of 0.925 or less and high resistance to a sulfuric acid-hydrogen peroxide mixture can be obtained. The element ratio between Re and Ru (Re:Ru) is preferably 1:99-1:1, more preferably 5:95-1:1, and even more preferably 1:9-1:1.

When the phase shift film 13 contains Cr as the element X2, the element ratio between Cr and Ru (Cr:Ru) is, for example, 1:99-4:1. When the element ratio Cr:Ru is 1:99-4:1, the above formula (1) is satisfied, and an etching rate higher than that of Ru alone is obtained. When a value of the ratio (Cr/Ru) is 4/1 or less, a RuCr film having a refractive index of 0.925 or less and high resistance to a sulfuric acid-hydrogen peroxide mixture can be obtained. When the value of the ratio (Cr/Ru) is less than 1/99, an etching rate higher than that of Ru cannot be obtained, and when the value of the ratio (Cr/Ru) is 83/17 or more, a RuCr film having a refractive index of 0.926 or more is obtained. The element ratio between Cr and Ru (Cr:Ru) is preferably 1:99-4:1, more preferably 5:95-4:1, even more preferably 5:95-42:58, and particularly preferably 1:9-42:58.

The phase shift film 13 may contain, in addition to Ru and X2, at least one element Y2 selected from the group consisting of B, C, O, and N. For example, the phase shift film 13 may contain RuTaN. The phase shift film 13 is not particularly limited, but may contain, for example, 0.01 at %-59 at % of the element Y2.

The refractive index n of the phase shift film 13 is, for example, 0.925 or less, preferably 0.920 or less, more preferably 0.910 or less, and even more preferably 0.90 or less. The refractive index n is preferably 0.885 or more. In the specification of the present application, the refractive index is a refractive index for light with a wavelength of 13.5 nm.

An extinction coefficient k of the phase shift film 13 is, for example, 0.024 or more, preferably 0.030 or more, and more preferably 0.035 or more. Further, the extinction coefficient k is preferably 0.065 or less. In the specification of the present application, the extinction coefficient is an extinction coefficient for light with a wavelength of 13.5 nm.

As the optical characteristics (refractive index n and extinction coefficient k) of the phase shift film 13, values found in the database provided by the Center for X-Ray Optics, Lawrence Berkeley National Laboratory, or values calculated from the "dependency on incident angle" of reflectance, which will be described later, are used.

An incident angle θ of EUV light, reflectance R with respect to the EUV light, refractive index n of the phase shift film 13, and the extinction coefficient k of the phase shift film 13 satisfy the following formula (3).

[Equation 4]

$$R = \left| \frac{\sin\theta - ((n+ik)^2 - \cos^2\theta)^{1/2}}{\sin\theta + ((n+ik)^2 - \cos^2\theta)^{1/2}} \right|. \quad (3)$$

Measurements were performed for a plurality of combinations of the incident angle θ and the reflectance R, and the refractive index n and the extinction coefficient k were calculated by the least-squares method so that a sum of errors between the measured data and values obtained using the formula (3) was minimized.

The etching rate for the phase shift film 13 with sulfuric acid-hydrogen peroxide mixture is 0 nm/min-0.05 nm/min. A sulfuric acid-hydrogen peroxide mixture is used for removing a resist film, cleaning the reflective mask 2, or the like. When the etching rate for the phase shift film 13 with sulfuric acid-hydrogen peroxide mixture is 0.05 nm/min, damage to the phase shift film 13 during cleaning can be suppressed.

The method of forming the phase shift film 13 includes, for example, a DC sputtering method, a magnetron sputtering method, or an ion beam sputtering method.

The etching mask film 14 is formed on the phase shift film 13, and is used to form an opening pattern 13a in the phase shift film 13. A resist film (not shown) is provided on the etching mask film 14. In the process of manufacturing the reflective mask 2, a first opening pattern is first formed in the resist film, a second opening pattern is then formed in the etching mask film 14 using the first opening pattern, and a third opening pattern 13a is then formed in the phase shift film 13 using the second opening pattern. The first opening pattern, the second opening pattern, and the third opening pattern 13a have the same dimensions and the same shape in a plan view (viewed in the Z-axis direction). The etching mask film 14 enables the resist film to be thinned.

The etching mask film 14 contains at least one element selected from the group consisting of aluminum (Al), hafnium (Hf), yttrium (Y), chromium (Cr), niobium (Nb), titanium (Ti), molybdenum (Mo), tantalum (Ta), ruthenium (Ru), and silicon (Si). The etching mask film 14 may contain at least one element selected from the group consisting of oxygen (O), nitrogen (N), carbon (C), and boron (B) in addition to the above-described element. The etching mask film 14 preferably contains at least one element selected from the group consisting of O, N, and B, and more preferably contains at least one element selected from the group consisting of O and N.

A film thickness of the etching mask film 14 is preferably greater than or equal to 2 nm and less than or equal to 30 nm, more preferably greater than or equal to 2 nm and less than or equal to 25 nm, and further preferably greater than or equal to 2 nm and less than or equal to 10 nm.

The method of forming the etching mask film 14 includes, for example, a DC sputtering method, a magnetron sputtering method, or an ion beam sputtering method.

Figure 7:
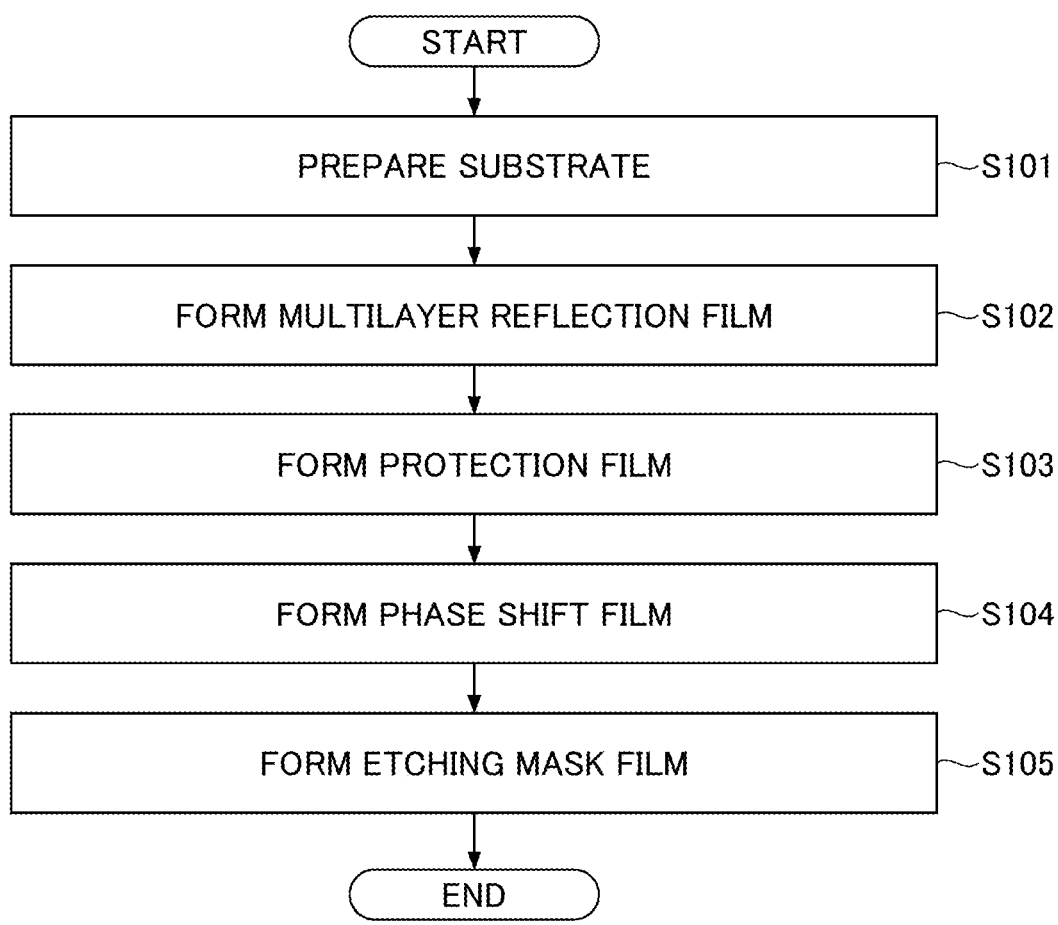
FIG. 7 is a flowchart showing a method of manufacturing the reflective mask blank according to the embodiment.

Next, a method of manufacturing the reflective mask blank 1 according to one embodiment will be described with reference to FIG. 7. The method of manufacturing the reflective mask blank 1 includes, for example, steps S101 to S105 shown in FIG. 7, i.e., the method includes preparing a substrate 10 (step S101); forming a multilayer reflective film 11 on a first main surface 10a of the substrate 10 (step S102); forming a protection film 12 on the multilayer reflective film 11 (step S103); forming a phase shift film 13 on the protection film 12 (step S104); and forming an etching mask film 14 on the phase shift film 13 (step S105).

The method of manufacturing the reflective mask blank 1 may include at least steps S101, S102, and S104. The method of manufacturing the reflective mask blank 1 may further include forming a functional film, which is not shown in FIG. 7. For example, the method of manufacturing the reflective mask blank 1 may include forming a buffer film 15 between the protection film 12 and the phase shift film 13.

Figure 8:
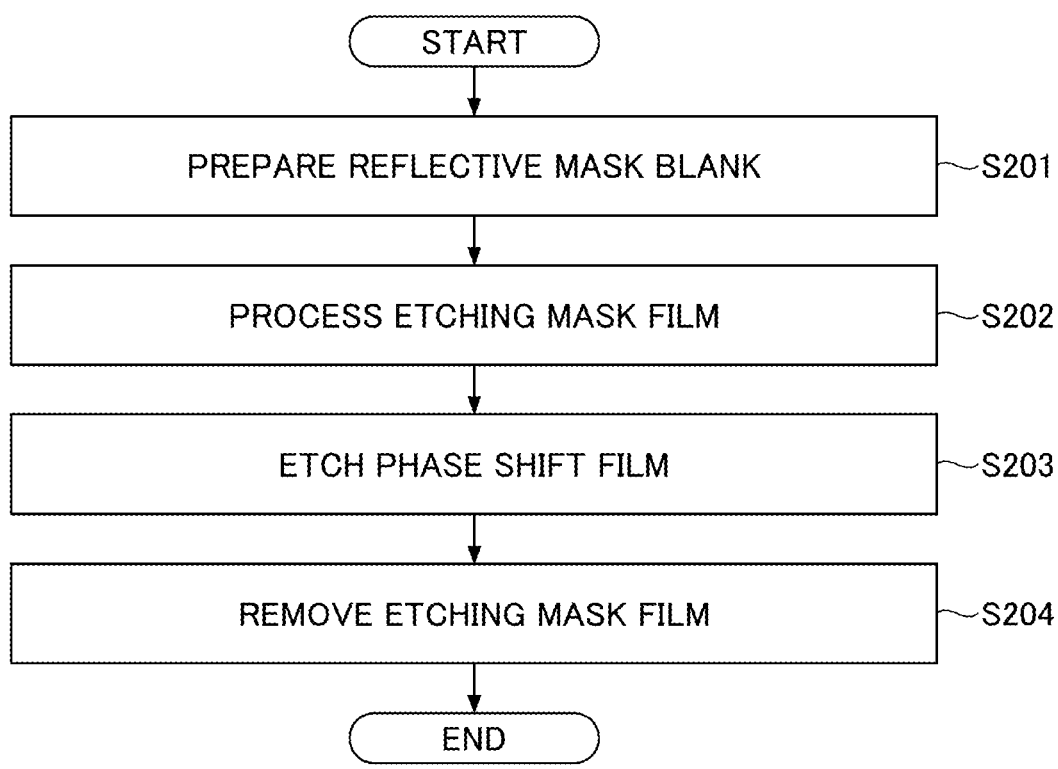
FIG. 8 is a flowchart showing a method of manufacturing the reflective mask according to the embodiment.

Next, a method of manufacturing the reflective mask 2 according to an embodiment will be described with reference to FIG. 8. The method of manufacturing the reflective mask 2 includes steps S201 to S204 shown in FIG. 8, i.e., the method includes preparing a reflective mask blank 1 (step S201); processing an etching mask film 14, a resist film (not shown) being provided on the etching mask film 14, a first opening pattern being formed in a resist film, and then a second opening pattern being formed in an etching mask film 14 by using the first opening pattern (step S202); forming a third opening pattern 13a in a phase shift film 13 using the second opening pattern, the phase shift film 13 being etched using an etching gas (step S203); and removing the resist film and the etching mask film 14 (step S204). For removing the resist film, for example, a sulfuric acid-hydrogen peroxide mixture is used. For example, an etching gas is used to remove the etching mask film 14. The etching gas used in step S204 (removing the etching mask film 14) may be the same type as the etching gas used in step S203 (forming the opening pattern 13a). The method of manufacturing the reflective mask 2 may include at least steps S201 and S203.

EXAMPLES

Hereinafter, experimental data will be described. Examples 2, 3, 5 to 17, 21, 24, and 25 described below are practical examples. Examples 4, 18 to 20, 22, and 23 described below are comparative examples. Example 1 described below is a reference example.

In Example 1, an EUV mask blank including a substrate, a multilayer reflective film, a protection film, and a phase shift film was prepared.

As the substrate, a $SiO_2/TiO_2$ glass substrate having a square shape of 6 inches (152 mm) per side and a thickness of 6.3 mm was prepared. The glass substrate had a thermal expansion coefficient at 20° C. of $0.02 \times 10^{-7}/°$ C., a Young's modulus of 67 GPa, a Poisson's ratio of 0.17, and a specific stiffness of $3.07 \times 10^7$ m$^2$/s$^2$. The quality-guaranteed region of the first main surface of the substrate had a root mean square roughness Rq of 0.15 nm or less and a flatness of 100 nm or less obtained by polishing. On the second main surface of the substrate, a Cr film having a thickness of 100 nm was formed by a magnetron sputtering method. The sheet resistance of the Cr film was 100Ω/□.

As the multilayer reflective film, a Mo/Si multilayer reflective film was formed. The Mo/Si multilayer reflective film was formed by repeating times formation of a Si layer (film thickness: 4.5 nm) and a Mo layer (film thickness: 2.3 nm) by an ion beam sputtering method. A total film thickness of the Mo/Si multilayer reflective film was 272 nm ((4.5 nm+2.3 nm)×40).

As the protection film, a Rh film (film thickness: 2.5 nm) was formed. The Rh film was formed using a DC sputtering method. The reflectance for EUV light by the multilayer reflective film after the protection film was formed, that is, the reflectance for the first EUV light L1 shown in FIG. 3, was 64.5% at the maximum.

In Example 1, a Ru film (film thickness: 32 nm, Ru content: 100 at %) was formed as the phase shift film. The Ru film was formed using a DC sputtering method. The characteristics of the phase shift film will be shown in TABLE 1.

In each of Examples 2 to 25, an EUV mask blank was prepared under the same condition as in Example 1 except for the chemical composition and the film thickness of the phase shift film. The characteristics of the phase shift film are shown in TABLE 1. In each of Examples 2 to 25, the phase shift film was an alloy film.

TABLE 1

| | Composition | | | Optical constant | | Film thickness (nm) | SPM resistance | MP1 (° C.) | MP2 (° C.) | Formula (1) | Formula (2) | Etching CF$_4$:O$_2$ | Etching rate (nm/min) |
|---|---|---|---|---|---|---|---|---|---|---|---|---|---|
| | Material | X2 | X2 (at %) | n | k | | | | | | | | |
| Ex. 1 | Ru | — | 0 | 0.893 | 0.016 | — | — | 25 | 600 | — | — | — | 18 |
| Ex. 2 | RuTa | Ta | 18 | 0.904 | 0.019 | 45 | OK | 358 | 509 | OK | OK | 4:28 | 31 |
| Ex. 3 | RuTa | Ta | 46 | 0.922 | 0.024 | 50 | OK | 876 | 369 | OK | OK | 8:24 | 27 |
| Ex. 4 | RuTa | Ta | 62 | 0.932 | 0.027 | 56 | OK | 1172 | 288 | NG | NG | 8:24 | 10 |
| Ex. 5 | RuW | W | 20 | 0.901 | 0.019 | 42 | OK | 320 | 501 | OK | OK | 4:28 | 35 |
| Ex. 6 | RuW | W | 33 | 0.906 | 0.022 | 42 | OK | 512 | 437 | OK | OK | 4:28 | 26 |
| Ex. 7 | RuW | W | 47 | 0.912 | 0.024 | 47 | OK | 718 | 367 | OK | OK | 8:24 | 24 |
| Ex. 8 | RuW | W | 70 | 0.921 | 0.028 | 50 | NG | 1058 | 254 | OK | OK | 8:24 | 26 |
| Ex. 9 | RuRe | Re | 20 | 0.895 | 0.018 | 40 | OK | 100 | 498 | OK | NG | 4:28 | 21 |
| Ex. 10 | RuRe | Re | 34 | 0.897 | 0.021 | 42 | OK | 153 | 427 | OK | OK | 4:28 | 27 |
| Ex. 11 | RuRe | Re | 45 | 0.900 | 0.023 | 42 | OK | 194 | 371 | OK | OK | 4:28 | 42 |
| Ex. 12 | RuRe | Re | 68 | 0.904 | 0.028 | 42 | NG | 280 | 253 | OK | OK | 4:28 | 58 |
| Ex. 13 | RuCr | Cr | 6 | 0.895 | 0.017 | 40 | OK | 163 | 567 | OK | NG | 4:28 | 19 |
| Ex. 14 | RuCr | Cr | 14 | 0.899 | 0.019 | 40 | OK | 347 | 524 | OK | OK | 4:28 | 27 |
| Ex. 15 | RuCr | Cr | 23 | 0.902 | 0.021 | 43 | OK | 553 | 475 | OK | OK | 4:28 | 37 |
| Ex. 16 | RuCr | Cr | 41 | 0.909 | 0.025 | 43 | OK | 966 | 377 | OK | OK | 4:28 | 36 |
| Ex. 17 | RuHf | Hf | 11 | — | — | — | OK | 331 | 647 | OK | NG | 4:28 | 20 |
| Ex. 18 | RuHf | Hf | 20 | — | — | — | OK | 580 | 685 | NG | NG | 8:24 | 13 |
| Ex. 19 | RuHf | Hf | 29 | — | — | — | OK | 830 | 723 | NG | NG | 4:28 | 3 |
| Ex. 20 | RuHf | Hf | 48 | — | — | — | OK | 1357 | 804 | NG | NG | 4:28 | 0 |
| Ex. 21 | RuAl | Al | 6 | — | — | — | OK | 147 | 699 | OK | NG | 4:28 | 23 |
| Ex. 22 | RuAl | Al | 20 | — | — | — | OK | 431 | 930 | NG | NG | — | — |
| Ex. 23 | RuAl | Al | 30 | — | — | — | OK | 634 | 1095 | NG | NG | — | — |
| Ex. 24 | RuTa | Ta | 26 | 0.910 | 0.021 | 45 | OK | 506 | 469 | OK | OK | 8:24 | 33 |
| Ex. 25 | RuTa | Ta | 37 | 0.917 | 0.023 | 49 | OK | 710 | 414 | OK | OK | 8:24 | 26 |

In TABLE 1, the melting point MP1 of the oxide of the RuX2 film was calculated using the following formula (4).

[Equation 5]

$$MP1 = MP1_A \times (100-\alpha)/100 + MP1_B \times \alpha/100. \quad (4)$$

In formula (4), $MP1_A$ is a melting point of an oxide of Ru, $MP1_B$ is a melting point of an oxide of X2, and a is a content (at %) of X2 in RuX2.

The melting point MP2 of the fluoride or the oxyfluoride of RuX2 shown in TABLE 1 was calculated using the following formula (5).

[Equation 6]

$$MP2 = MP2_A \times (100-\alpha)/100 + MP2_B \times \alpha/100. \quad (5)$$

In formula (5), $MP2_A$ is a melting point of a fluoride of Ru, $MP2_B$ is a melting point of a fluoride or an oxyfluoride of X2, and a is the content (at %) of X2 in RuX2.

TABLE 2 shows an example of the melting point of an oxide of Ru, the melting points of oxides of X2, the melting point of a fluoride of Ru, and the melting points of fluorides or oxyfluorides of X2.

TABLE 2

| Pure substance | Oxide | | Fluoride | | Oxyfluoride | |
|---|---|---|---|---|---|---|
| | Chemical composition | Melting point (° C.) | Chemical composition | Melting point (° C.) | Chemical composition | Melting point (° C.) |
| Ru | RuO$_4$ | 25.4 | RuF$_3$ | 600 | — | — |
| Ta | Ta$_2$O$_5$ | 1875 | TaF$_5$ | 96.9 | — | — |
| W | WO$_2$ | 1500 | — | — | WOF$_4$ | 105 |
| Re | ReO$_3$ | 400 | — | — | ReO$_2$F$_3$ | 90 |
| Cr | Cr$_2$O$_3$ | 2320 | — | — | CrOF$_4$ | 55 |
| Hf | HfO$_2$ | 2800 | HfF$_4$ | 1025 | — | — |
| Al | Al$_2$O$_3$ | 2054 | AlF$_3$ | 2250 | — | — |

As the melting points shown in TABLE 2, values described in a reference (CRC Handbook of Chemistry and Physics, 93rd Edition) were adopted. The oxide of each of the pure substances, and the fluoride or oxyfluoride of each of the pure substances, shown in TABLE 2, were selected based on knowledge of the inventors of the present application and references on etching.

The melting points MP1 and MP2 shown in TABLE 1 were calculated from the values shown in TABLE 2 by using the above formulas (4) and (5). When the Ru compound contains a pure substance, which is not shown in TABLE 2 as an element X2, an oxide, and a fluoride or an oxyfluoride of the element X2 are preferably selected based on references on etching or the like. When such a reference is not available, a compound of the element X2 having the lowest valence is preferably selected. The melting points MP1 and MP2 are calculated from a melting point of the compound by using the above formulas (4) and (5).

Each of the refractive indices n shown in TABLE 1 was calculated, in the same manner as the melting points MP1 and MP2 shown in TABLE 1, based on the content a (at %) of X2 in RuX2 and values of the optical constants of the pure substances described in TABLE 3 shown below.

TABLE 3

| Pure substance | Optical constant | |
| --- | --- | --- |
|  | n | K |
| Ru | 0.8930 | 0.0160 |
| Ta | 0.9567 | 0.0343 |
| W | 0.9329 | 0.0329 |
| Re | 0.9149 | 0.0399 |
| Cr | 0.9325 | 0.0389 |

From TABLE 3, the refractive index of Ru can be found to be low.

In TABLE 1, the SPM resistance of the phase shift film was evaluated and the etching rate ER of the phase shift film was measured as follows.

The SPM resistance of the phase shift film was evaluated according to an etching rate for the phase shift film in a sulfuric acid-hydrogen peroxide mixture based on a change in a film thickness of the phase shift film of an EUV mask blank which was immersed in the sulfuric acid-hydrogen peroxide mixture at 100° C. for 20 minutes. The change in the film thickness of the phase shift film was measured by X-ray reflectometry (XRR). The sulfuric acid-hydrogen peroxide mixture was prepared by mixing concentrated sulfuric acid and aqueous hydrogen peroxide solution in a ratio of 75 vol %:25 vol %, (concentrated sulfuric acid):(aqueous hydrogen peroxide solution). The concentrated sulfuric acid contained 96 vol % of sulfuric acid and 4 vol % of water. The aqueous hydrogen peroxide solution contained 30 vol %-35 vol % of hydrogen peroxide and 65 vol %-70 vol % of water. The SPM resistance was determined to be "OK" when the etching rate for the phase shift film in the sulfuric acid-hydrogen peroxide mixture was 0.05 nm/min or less. The SPM resistance was determined to be "NG" when the etching rate for the phase shift film in the sulfuric acid-hydrogen peroxide mixture was greater than 0.05 nm/min.

The etching rate ER of the phase shift film was obtained by performing an inductively coupled plasma (ICP) etching for the EUV mask blank placed on a sample stage of an ICP type plasma etching apparatus under the following conditions.

<Conditions of ICP Plasma Etching>
ICP antenna bias: 200 W;
Substrate bias: 40 W;
Trigger pressure: $3.5 \times 10^{0}$ Pa;
Etching pressure: $3.0 \times 10^{-1}$ Pa;
Etching gas: mixture gas of an $O_2$ gas and a $CF_4$ gas; and
Gas flow rate ($CF_4/O_2$): 24/8 sccm-4/28 sccm.

As is clear from TABLE 1, in Examples 2, 3, 5 to 17, 21, 24, and 25, the melting points MP1 and MP2 satisfied the formula (1), the etching rate ER was greater than that in Example 1, and the processability was better than that in Example 1.

On the other hand, in Examples 4, 18 to 20, 22, and 23, the melting points MP1 and MP2 did not satisfy the formula (1), the etching rate ER was less than that in Example 1, and the processability was worse than that in Example 1.

In addition, as is clear from TABLE 1, in Examples 2, 3, 5 to 8, 10 to 12, 14 to 16, 24, and 25, the melting points MP1 and MP2 satisfied both the formula (1) and the formula (2), the etching rate ER was further greater, and the processability was further better.

In Examples 2, 3, 5 to 7, 9 to 11, 14 to 16, 24, and 25, the element ratio between Ta and Ru (Ta:Ru) was 1:99-1:1, the element ratio between W and Ru (W:Ru) was 1:99-1:1, the element ratio between Re and Ru (Re:Ru) was 1:99-1:1, or the element ratio between Cr and Ru (Cr:Ru) was 1:99-4:1. Therefore, the refractive index was 0.925 or less and the SPM resistance was good.

On the other hand, in Example 8, since the ratio (W/Ru) exceeded 1/1, the SPM resistance was poor. In Example 12, since the ratio (Re/Ru) exceeded 1/1, the SPM resistance was poor.

TABLE 4 shows materials of the protection film or the buffer film. TABLE 4 also shows an etching rate ER for each of the materials, and a ratio (selection ratio) of the etching rate ER for RuTa in Example 2 to the etching rate ER for each material.

TABLE 4

| Material | Etching rate ER (nm/min) | Selection ratio |
| --- | --- | --- |
| Rh | 1 | 31.0 |
| Ru | 20 | 1.6 |
| SiO | 11 | 2.8 |
| TaN | 1 | 31.0 |
| TaON | 8 | 3.9 |
| CrN | 13 | 2.4 |

The etching rate for each material shown in TABLE 4 was measured under the same condition as the etching rate for RuTa in Example 2. When Rh is used as the material of the protection film, the selection ratio is 10.0 or more, and when Ru or SiO is used as the material of the protection film, the selection ratio is less than 10.0. When TaN or TaON is used as the material of the buffer film, the selection ratio is 3.0 or more, and when SiO or CrN is used as the material of the buffer film, the selection ratio is less than 3.0.

As described above, the reflective mask blank, the reflective mask, the method of manufacturing a reflective mask blank, and the method of manufacturing a reflective mask according to the present disclosure have been described. However, the present disclosure is not limited to the above-described embodiments, and the like. Various variations, modifications, substitutions, additions, deletions, and combinations are possible within the scope of claims. They also of course fall within the technical scope of the present disclosure.

What is claimed is:
1. A reflective mask blank comprising:
a substrate;
a multilayer reflective film that reflects EUV light; and
a phase shift film that shifts a phase of the EUV light, the substrate, the multilayer reflective film, and the phase shift film being arranged in this order, wherein the phase shift film contains a compound containing Ru and Cr, an element ratio between Cr and Ru (Cr:Ru) in the phase shift film is 5:95 to 42:58, and a melting point MP1 of an oxide of the compound and a melting point MP2 of a fluoride or an oxyfluoride of the compound satisfy the following relation (1):

$$0.625 MP1 + MP2 \leq 1000 \qquad (1).$$

2. The reflective mask blank according to claim 1, wherein the element ratio between Cr and Ru (Cr:Ru) in the phase shift film is 1:9 to 42:58.

3. The reflective mask blank according to claim 1, wherein a refractive index of the phase shift film is 0.925 or less.

4. The reflective mask blank according to claim 1, wherein an extinction coefficient k of the phase shift film is 0.024 or more.

5. The reflective mask blank according to claim 1, wherein the melting point MP1 of the oxide of the compound and the melting point MP2 of the fluoride or the oxyfluoride of the compound satisfy the following relation (2):

$$-0.500 MP1 + MP2 \leq 400 \qquad (2).$$

6. The reflective mask blank according to claim 1, wherein the phase shift film further contains, in addition to Ru and Cr, at least one element selected from the group consisting of B, C, O, and N.

7. The reflective mask blank according to claim 1, wherein a film thickness of the phase shift film is 50 nm or less.

8. The reflective mask blank according to claim 1 further comprising:

a protection film that protects the multilayer reflective film from an etching gas for etching the phase shift film, the protection film being arranged between the multilayer reflective film and the phase shift film, wherein a ratio of an etching rate of etching the phase shift film using the etching gas to an etching rate of etching the protection film using the etching gas is 10 or more.

9. The reflective mask blank according to claim 1, wherein the protection film contains Rh, or the protection film contains Rh and at least one element selected from the group consisting of Ru, Si, Al, Hf, Y, Ta, Nb, Mo, and Ir.

10. The reflective mask blank according to claim 1 further comprising:

a protection film that protects the multilayer reflective film from an etching gas for etching the phase shift film, the protection film being arranged between the multilayer reflective film and the phase shift film; and a buffer film that protects the protection film from the etching gas, the buffer film being arranged between the protection film and the phase shift film, wherein a ratio of an etching rate of etching the phase shift film using the etching gas to an etching rate of etching the buffer film using the etching gas is 3 or more.

11. The reflective mask blank according to claim 10, wherein the buffer film contains Ta, or the buffer film contains Ta and at least one element selected from the group consisting of O and N.

12. The reflective mask blank according to claim 1 further comprising:

an etching mask film on the phase shift film, wherein the etching mask film contains at least one element selected from the group consisting of Al, Hf, Y, Cr, Nb, Ti, Mo, Ta, Ru, and Si.

13. A reflective mask provided with the reflective mask blank according to claim 1, wherein the phase shift film includes an opening pattern.

14. A method of manufacturing a reflective mask blank, the method comprising:

forming a multilayer reflective film on a substrate, the multilayer reflective film reflecting EUV light; and forming a phase shift film over the multilayer reflective film, the phase shift film shifting a phase of the EUV light, wherein the phase shift film contains a compound containing Ru and Cr, an element ratio between Cr and Ru (Cr:Ru) in the phase shift film is 5:95 to 42:58, and a melting point MP1 of an oxide of the compound and a melting point MP2 of a fluoride or an oxyfluoride of the compound satisfy the following relation (1):

$$0.625 MP1 + MP2 \leq 1000 \qquad (1).$$

15. A method of manufacturing a reflective mask, the method comprising:

preparing a reflective mask blank manufactured by using the method according to claim 14; and forming an opening pattern in the phase shift film in the reflective mask blank.

16. The method of manufacturing a reflective mask according to claim 15, wherein an etching gas used for forming the opening pattern in the phase shift film is a mixed gas of a fluorine-based gas and an oxygen-based gas.

17. The method of manufacturing a reflective mask according to claim 16, wherein the fluorine-based gas is a $CF_4$ gas, a $CHF_3$ gas, a $SF_6$ gas, a $BF_3$ gas, a $XeF_2$ gas, or a mixture thereof.

18. The method of manufacturing a reflective mask according to claim 17, wherein a volume ratio between the oxygen-based gas and the fluorine-based gas, (oxygen-based gas):(fluorine-based gas), is 10:90 to 50:50.

* * * * *